US010204888B2

(12) United States Patent
Li et al.

(10) Patent No.: US 10,204,888 B2
(45) Date of Patent: *Feb. 12, 2019

(54) LED-BASED LIGHT SOURCES FOR LIGHT EMITTING DEVICES AND LIGHTING ARRANGEMENTS WITH PHOTOLUMINESCENCE WAVELENGTH CONVERSION

(71) Applicant: Intematix Corporation, Fremont, CA (US)

(72) Inventors: Yi-Qun Li, Danville, CA (US); Hwa (Harik) Su, Taipei (TW); Chienli (Jeff) Yang, Taipei (TW)

(73) Assignee: Intematix Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/376,385

(22) Filed: Dec. 12, 2016

(65) Prior Publication Data

US 2018/0130775 A1 May 10, 2018

Related U.S. Application Data

(60) Continuation of application No. 14/670,335, filed on Mar. 26, 2015, now Pat. No. 9,524,954, which is a (Continued)

(51) Int. Cl.
*H01L 25/075* (2006.01)
*F21V 9/30* (2018.01)
(Continued)

(52) U.S. Cl.
CPC .......... *H01L 25/0753* (2013.01); *F21K 9/232* (2016.08); *F21K 9/64* (2016.08);
(Continued)

(58) Field of Classification Search
CPC ... F21K 9/64; F21K 9/232; F21V 9/32; F21V 9/30; H01L 25/0753; H01L 33/54;
(Continued)

(56) References Cited

U.S. PATENT DOCUMENTS 3,290,255 A 12/1966 Smith
3,593,055 A 7/1971 Geusic et al.
(Continued)

FOREIGN PATENT DOCUMENTS

CN 101093827 A 12/2007
EP 647694 4/1995
(Continued)

OTHER PUBLICATIONS

International Search Report and Written Opinion for PCT/US2012/033310; dated Jul. 23, 2012, 11 pages.
(Continued)

*Primary Examiner* — Stephen F Husar
(74) *Attorney, Agent, or Firm* — Vista IP Law Group, LLP

(57) ABSTRACT

An LED-based light source for generating light having a selected dominant wavelength $\lambda_{ds}$ comprises a package housing a plurality of LEDs consisting of LEDs from first and second wavelength bins. The first wavelength bin comprises LEDs having a dominant wavelength $\lambda_{d1}$ that is within a first wavelength range and the second wavelength bin comprises LEDs having a dominant wavelength $\lambda_{d2}$ that is within a second wavelength range. The first wavelength bin can comprise LEDs having a dominant wavelength that is shorter than the selected dominant wavelength while the second wavelength bin comprises LEDs having a dominant wavelength that is longer than the selected dominant wavelength. The wavelength bins and number of LEDs are selected such that in operation the dominant wavelength of
(Continued)

the combined light emitted by the source is the selected dominant wavelength. Lighting arrangements and light emitting devices incorporating such light sources are disclosed.

18 Claims, 9 Drawing Sheets

Related U.S. Application Data division of application No. 13/444,716, filed on Apr. 11, 2012, now Pat. No. 9,004,705.

(60) Provisional application No. 61/475,134, filed on Apr. 13, 2011.

(51) Int. Cl.
| | |
|---|---|
| *H01L 33/48* | (2010.01) |
| *H01L 33/50* | (2010.01) |
| *H01L 33/54* | (2010.01) |
| *F21K 9/232* | (2016.01) |
| *F21K 9/64* | (2016.01) |
| *F21V 9/32* | (2018.01) |

(52) U.S. Cl.
CPC ............... *F21V 9/30* (2018.02); *F21V 9/32* (2018.02); *H01L 33/486* (2013.01); *H01L 33/507* (2013.01); *H01L 33/54* (2013.01); H01L 2224/48091 (2013.01); H01L 2224/73265 (2013.01); H01L 2924/0002 (2013.01)

(58) Field of Classification Search
CPC ............... H01L 33/486; H01L 33/507; H01L 2224/48091; H01L 2224/73265; H01L 2924/0002
See application file for complete search history.

(56) References Cited

U.S. PATENT DOCUMENTS

| | | |
|---|---|---|
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martie et al. |
| 3,763,405 A | 10/1973 | Mitsuhata |
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kano et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoberl |
| 4,176,294 A | 11/1979 | Thornton, Jr. |
| 4,176,299 A | 11/1979 | Thornton |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,959,316 A | 9/1999 | Lowery |
| 5,962,971 A | 10/1999 | Chen |
| 5,998,925 A | 12/1999 | Shimizu et al. |
| 6,137,217 A | 10/2000 | Pappalardo et al. |
| 6,340,824 B1 | 1/2002 | Komoto et al. |
| 6,504,301 B1 | 1/2003 | Lowery |
| 6,576,488 B2 | 6/2003 | Collins et al. |
| 6,600,175 B1 | 7/2003 | Baretz et al. |
| 6,642,618 B2 | 11/2003 | Yagi et al. |
| 6,642,652 B2 | 11/2003 | Collins et al. |
| 6,841,804 B1 | 1/2005 | Chen et al. |
| 6,869,812 B1 | 3/2005 | Liu |
| 7,153,015 B2 | 12/2006 | Brukilacchio |
| 7,311,858 B2 | 12/2007 | Wang et al. |
| 7,390,437 B2 | 6/2008 | Dong et al. |
| 7,479,662 B2 | 1/2009 | Soules et al. |
| 7,575,697 B2 | 8/2009 | Li et al. |
| 7,601,276 B2 | 10/2009 | Li et al. |
| 7,615,795 B2 | 11/2009 | Baretz et al. |
| 7,655,156 B2 | 2/2010 | Cheng et al. |
| 7,821,194 B2 * | 10/2010 | Negley ............... F21K 9/00 313/498 |
| 7,943,945 B2 | 5/2011 | Baretz et al. |
| 9,004,705 B2 * | 4/2015 | Li ............... F21V 9/16 362/84 |
| 9,524,954 B2 * | 12/2016 | Li ............... F21V 9/16 |
| 2004/0016938 A1 | 1/2004 | Baretz et al. |
| 2006/0049416 A1 | 3/2006 | Baretz et al. |
| 2006/0158090 A1 | 7/2006 | Wang et al. |
| 2008/0111472 A1 | 5/2008 | Liu et al. |
| 2008/0224597 A1 | 9/2008 | Baretz et al. |
| 2008/0224598 A1 | 9/2008 | Baretz et al. |
| 2009/0095966 A1 | 4/2009 | Keller et al. |
| 2009/0283721 A1 | 11/2009 | Liu et al. |
| 2010/0079059 A1 | 4/2010 | Roberts et al. |
| 2010/0140633 A1 | 6/2010 | Emerson |

(56) References Cited

U.S. PATENT DOCUMENTS

| | | |
|---|---|---|
| 2010/0290208 A1 | 11/2010 | Pickard |
| 2011/0050126 A1 | 3/2011 | Wang et al. |

FOREIGN PATENT DOCUMENTS

| | | |
|---|---|---|
| GB | 2 017 409 | 10/1979 |
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | P2003-234513 | 8/2003 |
| JP | P3724490 | 9/2005 |
| JP | P3724498 | 9/2005 |
| WO | WO 9108508 | 6/1991 |
| WO | WO 2010/074963 | 7/2010 |

OTHER PUBLICATIONS

ITMX-00319US1; Notice of Allowance for U.S. Appl. No. 13/444,716 dated Dec. 11, 2014.

"Fraunhofer-Gesellschaft: Research News Special1997", http://www.fhg.de/press/md-e/md1997/sondert2.hlm,(accessed on Jul. 23, 1998), Jan. 1997, Publisher: Fraunhofer Institute.

Adachi, C. et al., "Blue light-emitting organic electroluminescent devices", "Appl. Phys. Lett.", Feb. 26, 1990, pp. 799-801, vol. 56, No. 9.

Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

Apr. 14, 2010 Office Action in U.S. Appl. No. 11/264,124.

Apr. 15, 2009 Office Action in U.S. Appl. No. 11/264,124 issued by Abu I Kalam.

Armaroli, N. et al., "Supramolecular Photochemistry and Photophysics.", "J. Am. Chem. Soc.", 1994, pp. 5211-5217, vol. 116.

Aug. 21, 2006 Office Action in U.S. Appl. No. 10/623,198, issued by Thao X. Le.

Aug. 24, 2007 Office Action in U.S. Appl. No. 11/264,124, issued by Thao X. Le.

Aug. 26, 2010 Office Action in U.S. Appl. No. 12/131,118.

First Office Action for Chinese Patent Application No. 200780032995.8 dated Mar. 19, 2010.

Berggren, M. et al., "Light-emitting diodes with variable colours from polymer blends", "Nature", Dec. 1, 1994, pp. 444-446, vol. 372.

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.

Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.

Bradfield, P.L., et al., "Electroluminescence from sulfur impurities in a p-n junction formed in epitaxial silicon", "Appl. Phys. Lett", 07110/1989, pp. 10D-102, vol. 55, No. 2.

Chao, Zhang Jin, et al., "White light emitting glasses", "Journal of Solid State Chemistry", 1991, pp. 17-29, vol. 93.

Comrie, M. , "Full Color LED Added to Lumex's Lineup", "EBN", Jun. 19, 1995, p. 28.

CRC Handbook, 63rd Ed., (1983) p. E-201.

Das, N.C., et al., "Luminescence spectra of ann-channel metal-oxide-semiconductor field-effect transistor at breakdown", 1990, pp. 1152-1153, vol. 56, No. 12.

Dec. 16. 2004 Office Action in U.S. Appl. No. 10/623,198, issued by Thao X. Le.

Dictionary Definition of Phosphor, Oxford English Dictionary Online, Mar. 9, 2012 (Only partial available due to corrupt file, on Mar. 22, 2012 in U.S. Appl. No. 12/131,119; Request for Full Reference filed).

El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. 12/131,118, issued by Abul Kalam.

Feb. 26, 2008 Office Action in U.S. Appl. No. 11/264,124, issued by Abu I Kalam.

Feb. 4, 2005 Office Action in U.S. Appl. No. 10/623,198, issued by Thao X. Le.

Feb. 7, 2007 Office Action in U.S. Appl. No. 11/264,124, issued by Thao X. Le.

Forrest, S. et al. , "Organic emitters promise a new generation of displays", "Laser Focus World ", Feb. 1995, pp. 99-107.

Hamada, Y. et al. , "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Hamakawa, Yoshihiro, et al., "Toward a visible light display by amorphous SiC:H alloy system", "Optoelectronics—Devices and Technologies", Dec. 1989, pp. 281-294, vol. 4, No. 2.

Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.

Jang, S., "Effect of Avalanche-Induced Light Emission on the Multiplication Factor in Bipolar Junction Transistors", "Solid-State Electronics", 1991, pp. 1191-1196, vol. 34, No. 11.

Jan. 29, 2007 Office Action in U.S. Appl. No. 10/623,198, issued by Thao X. Le.

Jan. 30, 2006 Office Action in U.S. Appl. No. 11/264,124, issued by Thao X. Le.

Jan. 7, 2011 Office Action in U.S. Appl. No. 12/131,119, issued by Steven Y. Horikoshi.

Jul. 10, 2008 Office Action in U.S. Appl. No. 11/264,124, issued by Abu I Kalam.

Jul. 14, 2005 Notice of Allowance, Notice of Allowability, and Examiner's Statement of Reasons for Allowance in U.S. Appl. No. 10/623,198, issued by Thao X. Le.

Jul. 14, 2011 Office Action in U.S. Appl. No. 12/131,119, issued by Steve Horikoshi.

Jul. 7, 2011 Office Action in U.S. Appl. No. 12/131,118, issued by Abu I Kalam.

Jun. 14, 2006 Office Action in U.S. Appl. No. 11/264,124, issued by Thao X. Le.

Jun. 26, 2007 Office Action in U.S. Appl. No. 10/623,198, issued by Thao X. Le.

Kido, J. et al. , "1,2,4-Triazole Derivative as an Electron Transport Layer in Organic Luminescent Devices", "Jpn. J. Appl. Phys. ", Jul. 1, 1993, pp. L917-L920, vol. 32.

Kido, J. et al. , "Bright blue electroluminescence from poly(N-vinylcarbazole)", "Appl. Phys. Letters", Nov. 8, 1993, pp. 2627-2629, vol. 63, No. 19.

(56) References Cited

OTHER PUBLICATIONS

Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.

Krames, M., et al., "Status and Future of High-Power Light-Emitting Diodes for Solid-Slate Lighting", "Journal of Display Technology", Jun. 2007, pp. 160-175, vol. 3, No. 2.

Kudryashov, V., et al., "Spectra of Superbright Blue and Green InGaN/AlGaN/GaN Light-Emitting diodes", "Journal of the European Ceramic Society", May 1996, pp. 2033-2037, vol. 17.

Larach, S., et al., "Blue emitting luminescent phosphors: Review and status", "Int'l Workshop on Electroluminescence", 1990, pp. 137-143.

LEDs and Laser Diodes, Electus Distribution, copyright 2001, available at URL:http://www.jaycar.com.au/images_uploaded/ledlaser.Pdf.

Lester, S., et al., "High dislocation densities in high efficiency GaN-based light-emitting diodes", "Appl. Phys. Lett.", Mar. 6, 1995, pp. 1249-1251, vol. 66, No. 10.

Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn: documentum:eCommerce_soi_EU :09007bb280021e27.pdf:09007bb280021e27.pdf.

Mar. 2, 2009 Office Action in U.S. Appl. No. 10/623,198, issued by Abu I Kalam.

Mar. 22, 2012 Office Action in U.S. Appl. No. 12/131,119, issued by Steven Y. Horikoshi.

Mar. 28, 2006 Office Action in U.S. Appl. No. 10/623,198, issued by Thao X. Le.

Mar. 4, 2011 Notice of Allowance, Notice of Allowability, Examiner's Interview Summary, Examiner's Amendment/Comment and Examiner's Statement of Reason for Allowance in U.S. Appl. No. 11/264,124, issued by Abu I Kalam.

Mar. 7, 2008 Office Action in U.S. Appl. No. 10/623,198, issued by Abu I Kalam.

Maruska, H.P., "Gallium nitride light-emitting diodes (dissertation)", "Dissertation Submitted to Stanford University", Nov. 1973.

Maruska, H.P., et al., "Violet luminescence of Mg-doped GaN", "Appl. Phys. Lett.", Mar. 15, 1973, pp. 303-305, vol. 22, No. 6.

May 4, 2010 Office Action in U.S. Appl. No. 12/131,119.

McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.

McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.

Mimura, Hidenori, et al., "Visible electroluminescence from uc-SiC/porous Si/c-Si p-n junctions", "Int. J. Optoelectron.", 1994, pp. 211-215, vol. 9, No. 2.

Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.

Morkoc et al., "Large-band-gap SIC, 111-V nitride, and II-VI ZnSe-based semiconductor device technologies", J. Appl. Phys. 76(3), 1; Mar. 17, 1994; Illinois University.

Muench, W.V., et al., "Silicon carbide light-emitting diodes with epitaxial junctions", "Solid-State Electronics", Oct. 1976, pp. 871-874, vol. 19, No. 10.

Mukai, T., et al., "Recent progress of nitride-based light emitting devices", "Phys. Stat. Sol.", Sep. 2003, pp. 52-57, vol. 200, No. 1.

Nakamura, S., et al., "High-power InGaN single-quantum-well-structure blue and violet light-emitting diodes", "Appl. Phys. Lett.", Sep. 25, 1995, pp. 1868-1870, vol. 67, No. 13.

Nakamura, S., et al., "The Blue Laser Diode: GaN Based Light Emitters and Lasers", Mar. 21, 1997, p. 239, Publisher: Springer-Verlag.

Nakamura, S., et al., "The Blue Laser Diode: The Complete Story, 2nd Revised and Enlarged Edition", Oct. 2000, pp. 237-240, Publisher: Springer-Verlag.

Nov. 30, 2010 Office Action in U.S. Appl. No. 12/131/118.

Oct. 20, 2008 Office Action in U.S. Appl. No. 10/623,198, issued by Abu I Kalam.

Pankove, J.I., et al., "Scanning electron microscopy studies of GaN", "Joumal of Applied Physics", Apr. 1975, pp. 1647-1652, vol. 46, No. 4.

Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.

Pei, Q, et al., "Polymer Light-Emitting Electrochemical Cells", "Science", Aug. 25, 1995, pp. 1086-1088, vol. 269, No. 5227.

Reexam Advisory Action dated Sep. 28, 2012 for U.S. Appl. No. 90/010,940.

Reexam Final Office Action dated May 24, 2012 for U.S. Appl. No. 90/010,940.

Reexam Final Office Action dated Nov. 7, 2011 for U.S. Appl. No. 90/010,940.

Reexam Non-Final Office Action dated Jan. 26, 2012 for U.S. Appl. No. 90/010,940.

Reexam Non-Final Office Action dated Mar. 3, 2011 for U.S. Appl. No. 90/010,940.

Reexam Non-Final Office Action dated Sep. 20, 2010 for U.S. Appl. No. 90/010,940.

Roman. D., "LEDs Turn a Brighter Blue", "Electronic Buyers' News", Jun. 19, 1995, pp. 28 and 35, vol. 960, Publisher: CMP Media LLC.

Saleh and Teich, Fundamentals of Photonics, New York: John Wiley & Sons, 1991, pp. 592-594.

Sato, Yuichi, et al., "Full-color fluorescent display devices using a near-UV light-emitting diode", "Japanese Journal of Applied Physics", Jul. 1996, pp. L838-L839, vol. 35, No. ?A.

Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.

Sep. 29, 2009 Office Action in U.S. Appl. No. 11/264,124, issued by Abu I Kalam.

Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.

Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.

The Penguin Dictionary of Electronics, 3rd edition, pp. 315,437-438, 509-510, copyright 1979, 1988, and 1998.

Ura, M. , "Recent trends of development of silicon monocarbide blue-light emission diodes", "Kinzoku", 1989, pp. 11-15, vol. 59, No. 9.

Werner, K. , "Higher Visibility for LEDs", "IEEE Spectrum", Jul. 1994, pp. 30-39.

Wojciechowski, J. et al. , "Infrared-To-Blue Up-Converting Phosphor", "Electron Technology", 1978, pp. 31-47, vol. 11, No. 3.

Yamaguchi, Y. et al., "High-Brightness SiC Blue LEDs and Their Application to Full Color LED Lamps", "Optoelectronics-Devices and Technologies", Jun. 1992, pp. 57-67, vol. 7, No. 1.

Yang, Y., et al., "Voltage controlled two color light-emitting electrochemical cells", "Appl. Phys. Lett.", 1996, vol. 68, No. 19.

Yoshimi, Masashi, et al., "Amorphous carbon basis blue light electroluminescent device", "Optoelectronics-Devices and Technologies", Jun. 1992, pp. 69-81, vol. 7, No. 1.

Zanoni, E., et al., "Impact ionization, recombination, and visible light emission in AlGaAs/GaAs high electron mobility transistors", "J. Appl. Phys.", 1991, pp. 529-531, vol. 70, No. 1.

(56) References Cited

OTHER PUBLICATIONS

Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
First Office Action for CN Patent Appln. No. 201280023125.5 dated Nov. 5, 2014.
Second Office Action for CN Patent Appln. No. 201280023125.5 dated Sep. 28, 2015.
Non-Final Office Action dated Feb. 3, 2016 for U.S. Appl. No. 14/670,335.
Notice of Allowance dated Aug. 12, 2016 for U.S. Appl. No. 14/670,335.

\* cited by examiner

Section A-A

LED-BASED LIGHT SOURCES FOR LIGHT EMITTING DEVICES AND LIGHTING ARRANGEMENTS WITH PHOTOLUMINESCENCE WAVELENGTH CONVERSION

CROSS REFERENCE TO RELATED APPLICATIONS

This application is a continuation of U.S. patent application Ser. No. 14/670,335, filed on Mar. 26, 2015, titled "LED-BASED LIGHT SOURCES FOR LIGHT EMITTING DEVICES AND LIGHTING ARRANGEMENTS WITH PHOTOLUMINESCENCE WAVELENGTH CONVERSION", now issued as U.S. Pat. No. 9,524,954, which is a divisional of U.S. patent application Ser. No. 13/444,716, filed on Apr. 11, 2012, titled "LED-BASED LIGHT SOURCES FOR LIGHT EMITTING DEVICES AND LIGHTING ARRANGEMENTS WITH PHOTOLUMINESCENCE WAVELENGTH CONVERSION", now issued as U.S. Pat. No. 9,004,705, which claims the benefit of priority to U.S. Provisional Patent Application No. 61/475,134, filed Apr. 13, 2011, entitled "LIGHT EMITTING DEVICES WITH REMOTE PHOSPHOR WAVELENGTH CONVERSION COMPONENT AND LED-BASED LIGHT SOURCES THEREFOR", the contents of which are hereby incorporated in their entirety.

BACKGROUND OF THE INVENTION

1. Field of the Invention

This invention relates to lighting arrangements and light emitting devices that use LED-based (Light Emitting Diode-based) light sources to excite a photoluminescence material, typically a phosphor, to generate a desired color of light. In particular, although not exclusively, the invention concerns lighting arrangements that use a photoluminescence wavelength conversion component that is positioned remotely to the light source. More particularly the invention concerns LED-based light sources for use in such lighting arrangements and devices.

2. Description of the Related Art

White light emitting LEDs ("white LEDs") are known and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photoluminescence materials, which absorb a portion of the radiation emitted by the LED and re-emit light of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor material combined with the light emitted by the phosphor provides light which appears to the eye as being nearly white in color.

Due to their long operating life expectancy (>50,000 hours) and high luminous efficacy (70 lumens per watt and higher) high brightness white LEDs are increasingly being used to replace conventional fluorescent, compact fluorescent and incandescent light sources.

Typically in white LEDs the phosphor material is mixed with a light transmissive material such as a silicone or epoxy material and the mixture applied directly to the light emitting surface of the LED die. It is also known to provide the phosphor material as a layer on, or incorporate the phosphor material within, an optical component (a photoluminescence wavelength conversion component) that is located remotely to the LED die(s). Advantages of providing the phosphor remote to the excitation source are a reduced likelihood of thermal degradation of the phosphor material and a more consistent color of generated light.

The inventors have discovered that the dominant wavelength of the excitation light (typically blue) used to excite the phosphor can have a significant effect on the color and/or color temperature of the light emitted by the arrangement/device. For example for a 3000K white light emitting arrangement a variation of 2.5 nm in the excitation wavelength results in a color shift of about one MacAdam ellipse in the output of the arrangement. The present invention arose in an endeavor to provide an LED-based light source for use with a photoluminescence wavelength conversion component that at least in part overcomes the limitations of the known sources.

SUMMARY OF THE INVENTION

Embodiments of the invention concern lighting arrangements and light emitting devices comprising LED-based light sources that are operable to generate excitation light (typically blue) with a selected dominant wavelength and at least one photoluminescence material that is operable to convert, through a process of photoluminescence, at least a portion of the excitation light to light of a different wavelength. The emission product of the arrangement/device comprises the combined light generated by the source and the photoluminescence material and is typically configured to appear white in color.

In this specification a "lighting arrangement" refers to a system comprising an LED-based light source and a photoluminescence wavelength conversion component and as such includes lamps, down lights, spot lights, bulbs etc. In contrast a "light emitting device" refers to a system in which the photoluminescence material in incorporated with the LED-based light source typically as a part of the packaging housing the LEDs.

In accordance with embodiments of the invention an LED-based light source for generating excitation light with the selected dominant wavelength comprises a plurality of LEDs that are selected from at least two different wavelength bins. The number of LEDs and the wavelength bins are selected such that the emission product of the source comprises light having a dominant wavelength corresponding to the selected wavelength. A particular advantage of the invention is that by combining LEDs from different wavelength bins in a single package, the source can generate excitation light having a dominant wavelength that varies by a smaller amount between nominally the same sources compared with sources composed of LEDs from a single wavelength bin. Moreover it is found that the variation in the dominant wavelength of such sources can be significantly smaller than the wavelength variation within a single wavelength bin. Furthermore the invention enables the use of less expensive LEDs from broader wavelength bins and/or LEDs from a number of wavelength bins. Initial results indicate that using a light source composed of LEDs from at least two different wavelength bins enables lighting arrangements/devices to be constructed that generate light with a consistency of two MacAdam ellipses for a given photoluminescence material/photoluminescence wavelength conversion component. Whilst light sources in accordance with embodiments of the invention find particular application in lighting arrangements that use a wavelength conversion component in which the photoluminescence material(s) is/are located remotely to the source, the sources further provide benefits for light emitting devices in which the photoluminescence material(s) are incorporated in the source package.

According to an embodiment of the invention a light source for generating light having a selected dominant wavelength comprises: a package housing a plurality of LEDs comprising at least one first LED from a first wavelength bin and at least one second LED from a second wavelength bin, wherein the first wavelength bin comprises LEDs having a dominant wavelength that is within a first wavelength range and the second wavelength bin comprises LEDs having a dominant wavelength that is within a second wavelength range. The first wavelength bin can comprise LEDs having a dominant wavelength that is shorter than the selected dominant wavelength and the second wavelength bin can comprise LEDs having a dominant wavelength that includes or is longer than the selected dominant wavelength.

The first and second LEDs can be selected from wavelength bins having the same peak luminous flux range. To enable each of the LEDs to be operated from a single power source the first and second LEDs are preferably selected from wavelength bins having the forward drive voltage range.

The wavelength bin and number of LEDs from each bin are selected such that in operation the dominant wavelength of the combined light emitted by the light source substantially corresponds to the selected dominant wavelength. The inventors have discovered that by combining LEDs from different wavelength bins, this enables a light source to be constructed having an emission product whose dominant wavelength is within a fraction, about one tenth, of the wavelength bin range of the selected dominant wavelength. For example where the light source is configured to generate blue light having a dominant wavelength in a range 450 nm to 480 nm the wavelength range of each wavelength bin is can be 2.5 nm. It has been found that such a wavelength range enables a light source to be constructed in accordance with the invention that has an emission product whose dominant wavelength is within about ±0.2 nm of the selected dominant wavelength. Such an excitation source enables lighting arrangements/devices to be constructed that generate white light with a consistency of two or less MacAdam ellipses.

In one embodiment the light source further comprises at least one third LED from a third wavelength bin in which the third wavelength bin comprises LEDs having a dominant wavelength that is within a third wavelength range and wherein the at least one LED is housed in the package. The third wavelength bin can comprise LEDs having a dominant wavelength that i) includes the selected dominant wavelength, ii) is shorter than the selected dominant wavelength or iii) is longer than the selected dominant wavelength.

To increase the CRI (Color Rendering Index) of generated light, the source can further comprise at least one red LED that is operable to generate red light of wavelength in a range 450 nm to 480 nm. The at least one red LED can be housed in the package together with the blue LEDs. In one arrangement the at least one red LED comprises a plurality of red LEDs comprising at least one first red LED from a first wavelength bin and at least one second red LED from a second wavelength bin, wherein the first wavelength bin comprises red LEDs having a dominant wavelength that is within a first wavelength range and the second wavelength bin comprises red LEDs having a dominant wavelength that is within a second wavelength range.

In some arrangements the LEDs are selected using the approximate relationship:

$$\lambda_{ds} \cong \frac{n_1 \cdot \lambda_{d1} \cdot \Phi_1 + n_2 \cdot \lambda_{d2} \cdot \Phi_2}{n_1 \cdot \Phi_1 + n_2 \cdot \Phi_2}$$

where $\lambda_{ds}$ is the selected dominant wavelength, $n_1$ is the number of first LEDs, $n_2$ is the number of second LEDs, $\lambda_{d1}$ is the dominant wavelength of the first LEDs, $\lambda_{d2}$ is the dominant wavelength of the second LEDs, $\Phi_1$ is the radiant flux of the first LEDs and $\Phi_2$ is the radiant flux of the second LEDs.

The light source can further comprise at least one photoluminescence material, typically a phosphor material, that is configured to convert at least a portion of the light generated by the source to light of a different wavelength and wherein the emission product of the source comprises the combination of light generated by the first and second LEDs and photoluminescence light generated by the photoluminescence material. In some devices the photoluminescence material(s) can be mixed with a light transmissive binder and the mixture applied to the LEDs. Where the source additionally comprises one or more red LEDs the photoluminescence material mixture can be applied to the blue LEDs only. The light transmissive binder can comprise a curable liquid polymer such as for example a polymer resin, a monomer resin, an acrylic, an epoxy, a silicone or a fluorinated polymer. Alternatively the LEDs can be encapsulated in a light transmissive material and the photoluminescence material(s) provided in a wavelength conversion component that is separate from the source. In such wavelength conversion components the photoluminescence material(s) can be incorporated within the component and homogeneously distributed throughout the volume of the component or provided as one or more layers on the surface of the component.

The package for housing the LEDs can comprise a cavity for housing a respective one of the LEDs. Alternatively the package can comprise one or more cavities for housing multiple LEDs.

According to an embodiment of the invention a lighting arrangement comprises: at least one light source for generating light having a selected dominant wavelength comprising a plurality of LEDs comprising at least one first LED from a first wavelength bin in which the first wavelength bin comprises LEDs having a dominant wavelength that is within a first wavelength range; at least one second LED from a second wavelength bin in which the second wavelength bin comprises LEDs having a dominant wavelength that is within a second wavelength range; and a package housing the LEDs; and a wavelength conversion component located remotely to the at least one source and operable to convert at least a portion of the light generated by the at least one source to light of a different wavelength, wherein the emission product of the arrangement comprises the combination of light generated by the at least one source and the wavelength conversion component; and wherein the wavelength conversion component comprises a light transmissive substrate and at least one photoluminescence material.

In one embodiment the photoluminescence material(s) is/are incorporated in the light transmissive substrate and is/are preferably homogeneously distributed throughout the volume of the substrate. Alternatively and/or in addition the photoluminescence material can be provided as a layer on a surface of the light transmissive substrate. Preferably the wavelength conversion layer comprises a mixture of the photoluminescence material and a light transmissive binder. The light transmissive binder can comprise a curable liquid polymer such as a polymer resin, a monomer resin, an acrylic, an epoxy, a silicone or a fluorinated polymer. The phosphor layer can be deposited by screen printing, slot die coating, spin coating, roller coating, drawdown coating or doctor blading (i.e. using a flexible blade or squeegee to draw the material over the surface).

The light transmissive substrate can comprise a plastics material such as a polycarbonate or an acrylic or a glass.

The wavelength conversion component can be positioned on the at least one light source or in a spaced relationship. When the component is in a spaced relationship it can be separated from the at least one source by a distance of at least 1 cm to reduce the transfer of heat and to reduce the likelihood of thermal degradation of the photoluminescence material(s).

According to an embodiment of the invention a light source for generating light having a selected dominant wavelength comprises a package housing a plurality of blue LEDs, wherein the blue LEDs are selected from at least two different wavelength bins in which each wavelength bin comprises LEDs that are operable to generate blue light having a dominant wavelength that is in a respective wavelength range. The light source can further comprise one or more of red LEDs that are operable to generate red light and which are housed in the package. As with the blue LEDs the red LED can comprise a plurality of red LEDs that are selected from at least two different wavelength bins in which each wavelength bin comprises red LEDs that are operable to generate red light having a dominant wavelength that is in a respective wavelength range.

Whilst the invention arose in relation to white light emitting arrangements/devices the invention also finds utility in arrangements/devices that are operable to generate light of colors other than white.

BRIEF DESCRIPTION OF THE DRAWINGS

In order that the present invention is better understood LED-based lighting arrangements, light emitting devices and light sources in accordance with embodiments of the invention will now be described, by way of example only, with reference to the accompanying drawings in which.

DETAILED DESCRIPTION OF THE INVENTION

Figure 1:
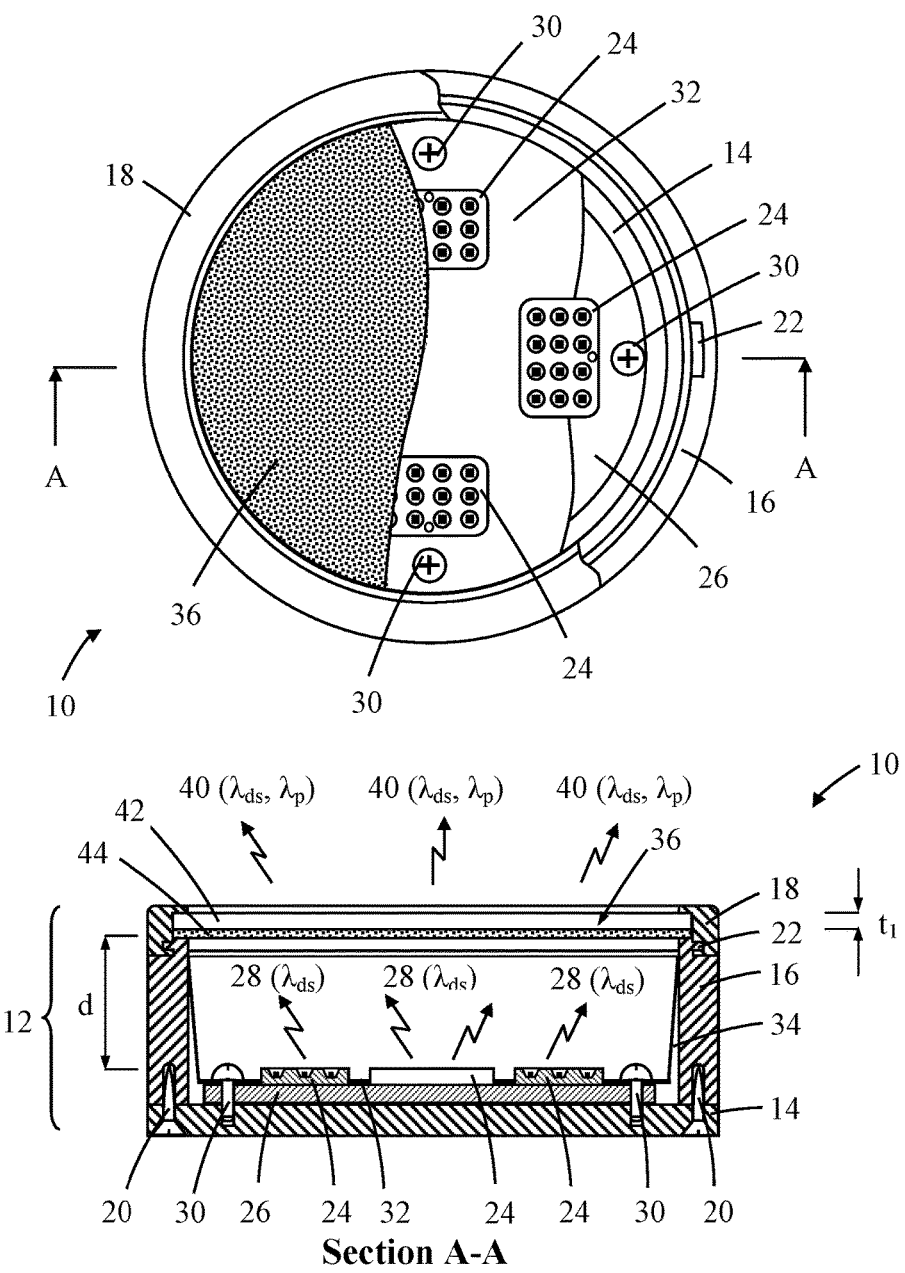
FIG. 1 shows schematic partial cutaway plan and sectional views of an LED-based lighting arrangement in accordance with an embodiment of the invention.

Throughout this patent specification like reference numerals are used to denote like parts.

LED-Based Lighting Arrangements (Lamps)

An LED-based lighting arrangement (lamp) 10 in accordance with an embodiment of the invention will now be described with reference to FIG. 1 which shows schematic partial cutaway plan and sectional views of the lamp. The lamp 10 is configured to generate warm white light with a CCT (Correlated Color Temperature) of approximately 3000K and a luminous flux of approximately 600 lumens. The lamp can be used, for example, for under cabinet lighting or incorporated into other lighting fixtures such as a down light, spot light, troffer etc.

The lamp 10 comprises a hollow cylindrical body 12 composed of a circular disc-shaped base 14, a hollow cylindrical wall portion 16 and a detachable annular top 18. To aid in the dissipation of heat the base 14 is preferably fabricated from aluminum, an alloy of aluminum or any material with a high thermal conductivity (preferably ≥200 $Wm^{-1}K^{-1}$) such as for example copper, a magnesium alloy or a metal loaded plastics material. For low cost production the wall 16 and top 18 are preferably fabricated from a thermoplastics material such as HDPP (High Density Polypropylene), nylon or PMA (polymethyl acrylate). Alternatively they can be fabricated from a thermally conductive material such as aluminum or an aluminum alloy. As indicated in FIG. 1 the base 14 can be attached to the wall portion 16 by screws or bolts 20 or by other fasteners or using an adhesive. As further shown in FIG. 1 the top 18 can be detachably mounted to the wall portion 16 using a bayonet-type mount in which radially extending tabs 22 engage in a corresponding annular groove in the top 18. The top 18 can be mounted and dismounted by rotating the top relative to the body. In other arrangements the top can be affixed to the wall portion using an adhesive or other fastening means.

The lamp 10 further comprises a plurality (four in the example illustrated) of blue light emitting LED-based light sources 24 that are mounted in thermal communication with a circular-shaped MCPCB (metal core printed circuit board) 26. The light sources 24 are described in detail below and are operable to generate blue excitation light 28 ($\lambda_{dS}$) with a selected dominant wavelength that is typically in a range 450 nm to 480 nm. As is known an MCPCB comprises a layered structure composed of a metal core base, typically aluminum, a thermally conductive/electrically insulating dielectric layer and a copper circuit layer for electrically connecting electrical components in a desired circuit configuration. The metal core base of the MCPCB 26 is mounted in thermal communication with the base 14 with the aid of a thermally conductive compound such as for example an adhesive containing a standard heat sink compound containing beryllium oxide or aluminum nitride. As shown in FIG. 1 the MCPCB can be attached to the base using screws or bolts 30.

To maximize the emission of light, the lamp 10 can further comprise light reflective surfaces 32, 34 that respectively cover the face of the MCPCB 26 and the inner curved surface of the top 18. Typically the light reflective surfaces 32, 34 can comprise a highly light reflective sheet material such as WhiteOptics™ "White 97" (a high-density polyethylene fiber-based composite film) from A.L.P. lighting Components, Inc of Niles, Ill., USA. As indicated in FIG. 1 a circular disc 32 of the material can be used to cover the face of the MCPCB with apertures for each source and a strip of the light reflective material configured as a cylindrical sleeve 34 that is inserted in the housing and is configured to cover the inner surface of the housing wall portion 16.

The lamp 10 further comprises a photoluminescence wavelength conversion component 36 that is operable to absorb a proportion of the blue excitation light 28 ($\lambda_{ds}$) generated by the sources 24 and convert it to light 38 of a different wavelength ($\lambda_p$) by a process of photoluminescence 36. The emission product 40 of the lamp 10 comprises the combined light 28, 38 of wavelengths $\lambda_{ds}$, $\lambda_p$ generated by the light sources 24 and the photoluminescence wavelength conversion component 36. The wavelength conversion component 36 (more particularly the photoluminescence material) is positioned remotely to the light sources 24 and is spatially separated from the light sources by an air gap of distance d that is typically at least 1 cm. In this patent specification "remotely" and "remote" means in a spaced or separated relationship. The separation can comprise an air gap as illustrated in FIG. 1 or a light transmissive medium. The wavelength conversion component 36 is configured to completely cover the housing 12 opening such that all light emitted by the device passes through the component 36. As shown the wavelength conversion component 36 can be detachably mounted to the top of the wall portion 16 using the top 18 enabling the component and emission color of the lamp to be readily changed. In other arrangements the wavelength conversion component can be affixed to the housing.

The wavelength conversion component comprises a light transmissive substrate 42 and a wavelength conversion layer 44 containing one or more photoluminescence materials. Typically the photoluminescence material(s) comprises a phosphor material though they can comprise other photoluminescence materials such as a quantum dot material or a combination thereof. As shown in FIG. 1 the wavelength conversion component 36 is configured such that in operation the wavelength conversion layer 44 faces the light sources 24. Additionally (not shown) the wavelength conversion component can comprise a light diffusing layer comprising a uniform thickness layer of light diffusive particles such as titanium dioxide ($TiO_2$), barium sulfate ($BaSO_4$), magnesium oxide (MgO), silicon dioxide ($SiO_2$) or aluminum oxide ($Al_2O_3$). The light diffusive material can not only improve the color uniformity of generated light but can additionally improve the off-state white appearance of the wavelength conversion component.

The light transmissive substrate 42 can be any material that is substantially transmissive to light over a wavelength range 380 nm to 740 nm and can comprise a light transmissive polymer such as a polycarbonate or acrylic or a glass such as a borosilicate glass. For example in FIG. 1 the substrate 42 comprises a planar circular disc of diameter $\phi=62$ mm and thickness $t_1$ which is typically 0.5 mm to 3 mm. In other embodiments the substrate can comprise other geometries such as being convex or concave in form such as for example being dome-shaped, dish-shaped or cylindrical.

The wavelength conversion layer 44 can comprise a uniform thickness layer composed of the photoluminescence material(s) and a light transmissive binder material. The binder can comprise a curable liquid polymer such as a polymer resin, a monomer resin, an acrylic, an epoxy (polyepoxide), a silicone or a fluorinated polymer. It is important that the binder material is, in its cured state, substantially transmissive to all wavelengths of light generated by the phosphor material(s) and the light sources 24 and preferably has a transmittance of at least 0.9 over the visible spectrum (380 nm to 800 nm). The binder material is preferably U.V. curable though it can be thermally curable, solvent based or a combination thereof. U.V. or thermally curable binders can be preferable because, unlike solvent-based materials, they do not "outgas" during polymerization.

Where the photoluminescence material comprises a phosphor material, which is in powder form, this is thoroughly mixed in known proportions with the liquid binder material to form a suspension and the resulting phosphor composition, "phosphor ink", deposited onto the light transmissive substrate. The wavelength conversion layer 44 is preferably deposited by screen printing though other deposition techniques such as slot die coating, spin coating, roller coating, drawdown coating or doctor blading can be used. The color of the emission product produced by the wavelength conversion component 36 will depend on the phosphor material composition and the quantity of phosphor material per unit area in the wavelength conversion layer 44. It will be appreciated that the quantity of phosphor material per unit area is dependent on the thickness of the wavelength conversion layer 44 and the weight loading of phosphor material to binder in the phosphor ink. In applications in which the emission product is white or in applications in which the emission product has a high saturation color (i.e. the emission product comprises substantially all photoluminescence generated light) the quantity of phosphor material per unit area in the wavelength conversion layer 44 will typically be between 10 mg·cm$^{-2}$ and 40 mg·cm$^{-2}$. To enable printing of the wavelength conversion layer 44 in a minimum number of print passes the phosphor ink preferably has as high a solids loading of phosphor material to binder material as possible and preferably has a weight loading of phosphor material to binder in a range 40% to 75%. The phosphor material comprises particles with an average particle size of 10 μm to 20 μm and typically of order 15 μm. In alternative arrangements (not shown) the phosphor material can be incorporated in the light transmissive substrate and homogeneously distributed throughout the volume of the substrate.

In general lighting applications the emission product 40 will typically be white light and the photoluminescence material can comprise one or more blue light excitable phosphor materials that emit green (510 nm to 550 nm), yellow-green (550 nm to 570 nm), yellow (570 nm to 590 nm), orange (590 nm to 630 nm) or red (630 nm to 740 nm) light. The thickness of the wavelength conversion layer 44, phosphor material composition and the density (weight loading) of phosphor material per unit area will determine the color of light emitted by the lamp 10.

The photoluminescence material can comprise an inorganic or organic phosphor such as for example silicate-based phosphor of a general composition $A_3Si(O,D)_5$ or $A_2Si(O,$ D)$_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 B2 "Silicate-based green phosphors" (assigned to Intematix Corp.), U.S. Pat. No. 7,601,276 B2 "Two phase silicate-based yellow phosphors" (assigned to Intematix Corp.), U.S. Pat. No. 7,655,156 B2 "Silicate-based orange phosphors" (assigned to Intematix Corp.) and U.S. Pat. No. 7,311,858 B2 "Silicate-based yellow-green phosphors" (assigned to Intematix Corp.). The phosphor can also comprise an aluminate-based material such as is taught in our co-pending patent application US2006/0158090 A1 "Novel aluminate-based green phosphors" and U.S. Pat. No. 7,390,437 B2 "Aluminate-based blue phosphors" (assigned to Intematix Corp.), an aluminum-silicate phosphor as taught in co-pending application US2008/0111472 A1 "Aluminum-silicate orange-red phosphor" or a nitride-based red phosphor material such as is taught in our co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can comprise any phosphor material including nitride and/or sulfate phosphor materials, oxy-nitrides and oxy-sulfate phosphors or garnet materials (YAG).

Figure 2:
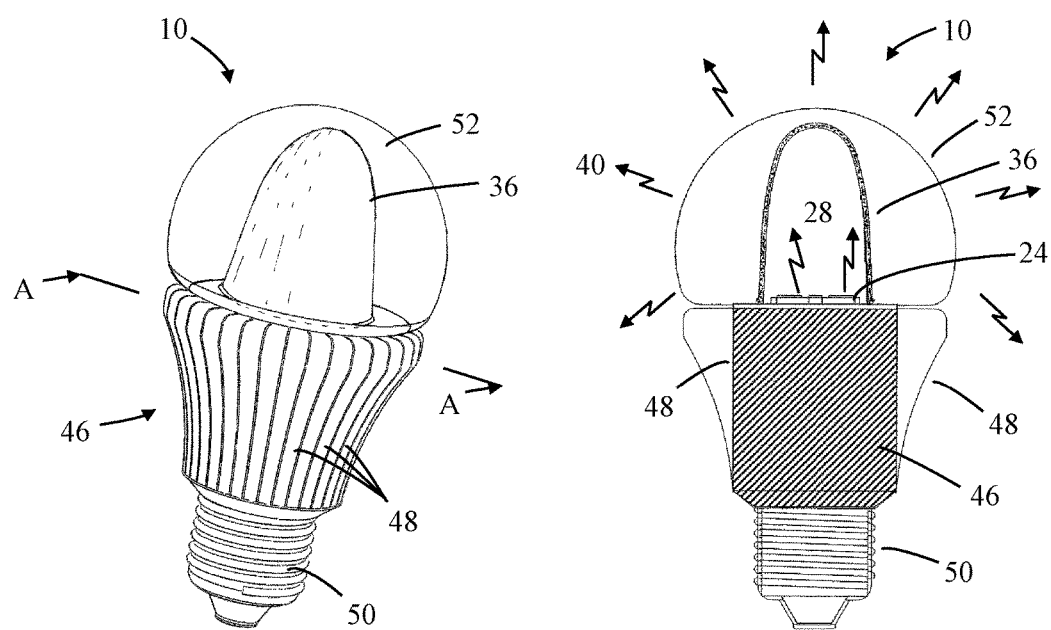
FIG. 2 shows schematic perspective and sectional views of an LED-based light bulb in accordance with an embodiment of the invention.

FIG. 2 shows perspective and cross sectional views of a LED-based light bulb (lamp) 10 in accordance with an embodiment of the invention. The lamp 10 comprises a generally conical shaped thermally conductive body 46 that includes a plurality of latitudinal heat radiating fins (veins) 48 circumferentially spaced around the outer curved surface of the body 46 to aid in the dissipation of heat. The lamp 10 further comprises a connector cap (Edison screw lamp base) 50 enabling the lamp to be directly connected to a power supply using a standard electrical lighting screw socket. The connector cap 50 is mounted to the truncated apex of the body 46. The lamp 10 further comprises one or more LED-based light sources 24 mounted in thermal communication with the base of the body 46. In order to generate white light the lamp 10 further comprises a photoluminescence wavelength conversion component 36 mounted to the base of the body and configured to enclose the sources 24. As indicated in FIG. 2 the wavelength conversion component 36 can be a generally dome shaped shell and includes one or more photoluminescence materials to provide wavelength conversion of blue light generated by the sources 24. The photoluminescence material can be incorporated in and homogeneously distributed throughout the volume of the component or provided as one or layers on the inner or outer surfaces of the component. For ease of fabrication the photoluminescence wavelength conversion component can be injection molded. For aesthetic considerations the lamp can further comprise a light transmissive envelope 52 which encloses the wavelength conversion component 36.

LED-Based Light Source

Figure 3:
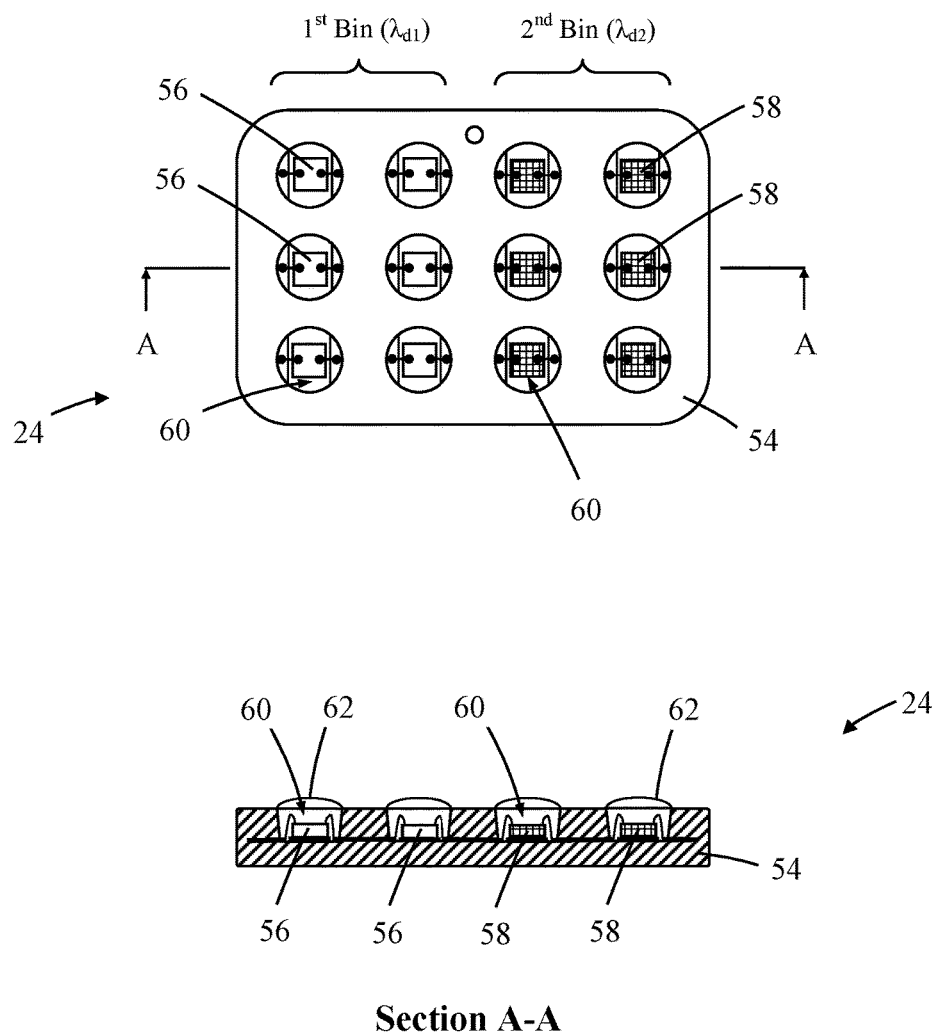
FIG. 3 shows schematic plan and sectional views of an LED-based light source in accordance with an embodiment of the invention for use in the arrangements of FIGS. 1 and 2.

In accordance with embodiments of the invention the LED-based light sources 24 can comprise a package or housing 54 that houses a plurality of first and second LED dies 56, 58. In the example shown in FIG. 3 the package comprises a low temperature co-fired ceramic (LTCC) having an array of circular recesses or cavities 60 in which each recess is configured to house a respective one of the LED dies 56, 58. The package can as shown comprise a square array of twelve cavities 60 (three rows by four columns) for housing six first LED dies 56 and six second LED dies 58. To provide protection of the LED dies 56, 58 and bond wires each recess 60 is filled with a light transmissive encapsulation 62 such as a silicone or epoxy. Each of the LED dies preferably comprises a blue light emitting GaN-based (gallium nitride-based) LED die. In accordance with the invention each of the first blue LED dies 56 are from a first wavelength bin that comprises LED dies having a dominant wavelength $\lambda_{d1}$ that is within a first wavelength range whilst each of the second blue LED dies 58 are from a second different wavelength bin that comprises LED dies having a dominant wavelength $\lambda_{d2}$ that is within a second different wavelength range. As is further described the number and radiant flux of the LED dies from the different wavelength bins and the choice of wavelength bins are selected such that the light source 24 generates light 28 having a dominant wavelength corresponding to the selected wavelength $\lambda_{ds}$.

Figure 4:
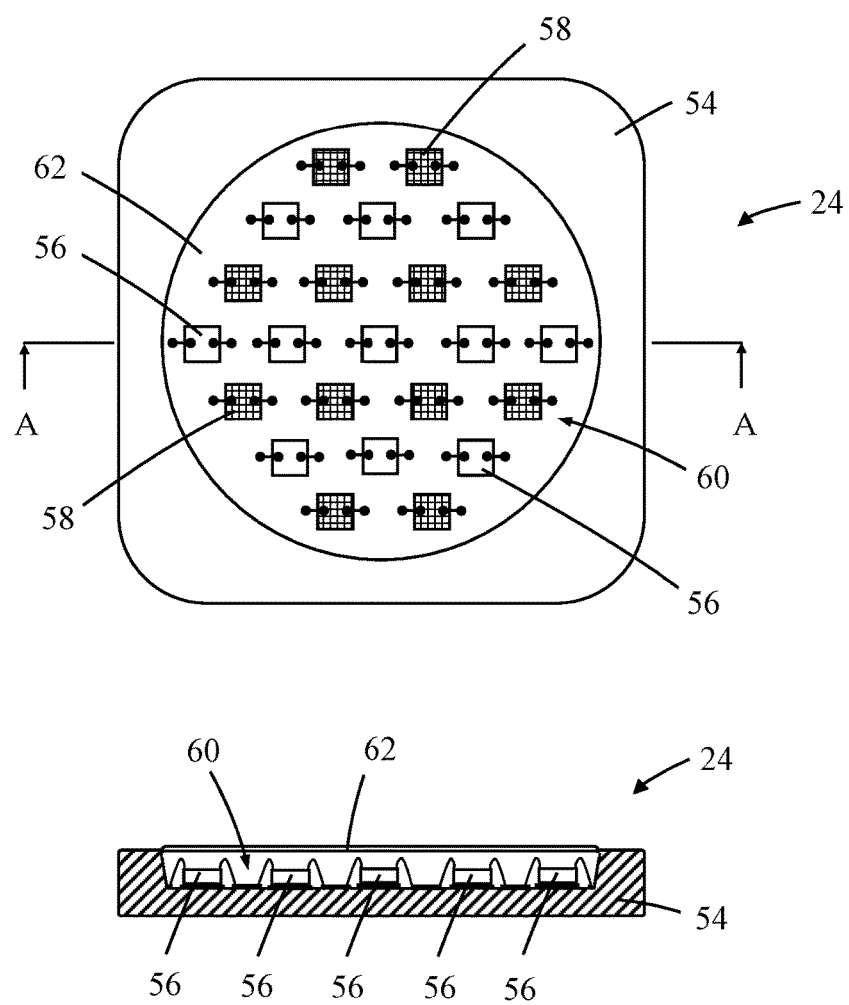
FIG. 4 shows schematic plan and sectional views of an LED-based light source in accordance with an embodiment of the invention for use in the arrangements of FIGS. 1 and 2.

An example of an LED-based light source 24 in accordance with a further embodiment of the invention is shown in FIG. 4. In this embodiment the package 54 has a single circular recess 60 that houses the first and second blue LED dies 56, 58. In the example shown in FIG. 4 the package houses a hexagonal array of twenty three LED dies comprising eleven first blue LED dies 46 and twelve second blue LED dies 58. The cavity recess can be filled with a light transmissive encapsulation 62 to protect the LED dies and wire bonds.

As is known LED dies are commonly classified (grouped) by a process known as binning. Typically the LED dies are binned according to the dominant wavelength $\lambda_d$ of light they generate and the radiant flux 1 (defined in watts) of light they generate for a selected forward voltage ($V_F$).

TABLE 1 shows an example of a binning scheme for blue LED dies. In the example there are thirty two bins comprising four bins for each of eight wavelength range bins. For example bin 9 comprises LED dies that generate light having a dominant wavelength $\lambda_d$ in a range 450.0 nm to 452.5 nm and a radiant flux $\Phi_1$ for a forward voltage $V_{F1}$ whilst bin 21 comprises LED dies that generate light having a dominant wavelength $\lambda_d$ in a range 457.5 nm to 460.0 nm) and a radiant flux $\Phi_1$ for a forward voltage $V_{F1}$.

TABLE 1

| wavelength bin $\lambda_d$ (nm) | Dominant wavelength range (nm) | LED Bin Radiant Flux $\Phi_1$ for $V_{F1}$, $V_{F2}$ | Radiant Flux $\Phi_2$ for $V_{F1}$, $V_{F2}$ |
|---|---|---|---|
| 445.0 | 445.0 to 447.5 | 1, 2 | 3, 4 |
| 447.5 | 447.5 to 450.0 | 5, 6 | 7, 8 |
| 450.0 | 450.0 to 452.5 | 9, 10 | 11, 12 |
| 452.5 | 452.5 to 455.0 | 13, 14 | 15, 16 |
| 455.0 | 455.0 to 457.5 | 17, 18 | 19, 20 |
| 457.5 | 457.5 to 460.0 | 21, 22 | 23, 24 |
| 460.0 | 460.0 to 462.5 | 25, 26 | 27, 28 |
| 462.5 | 462.5 to 465.0 | 29, 30 | 31, 32 |

Figure 5:
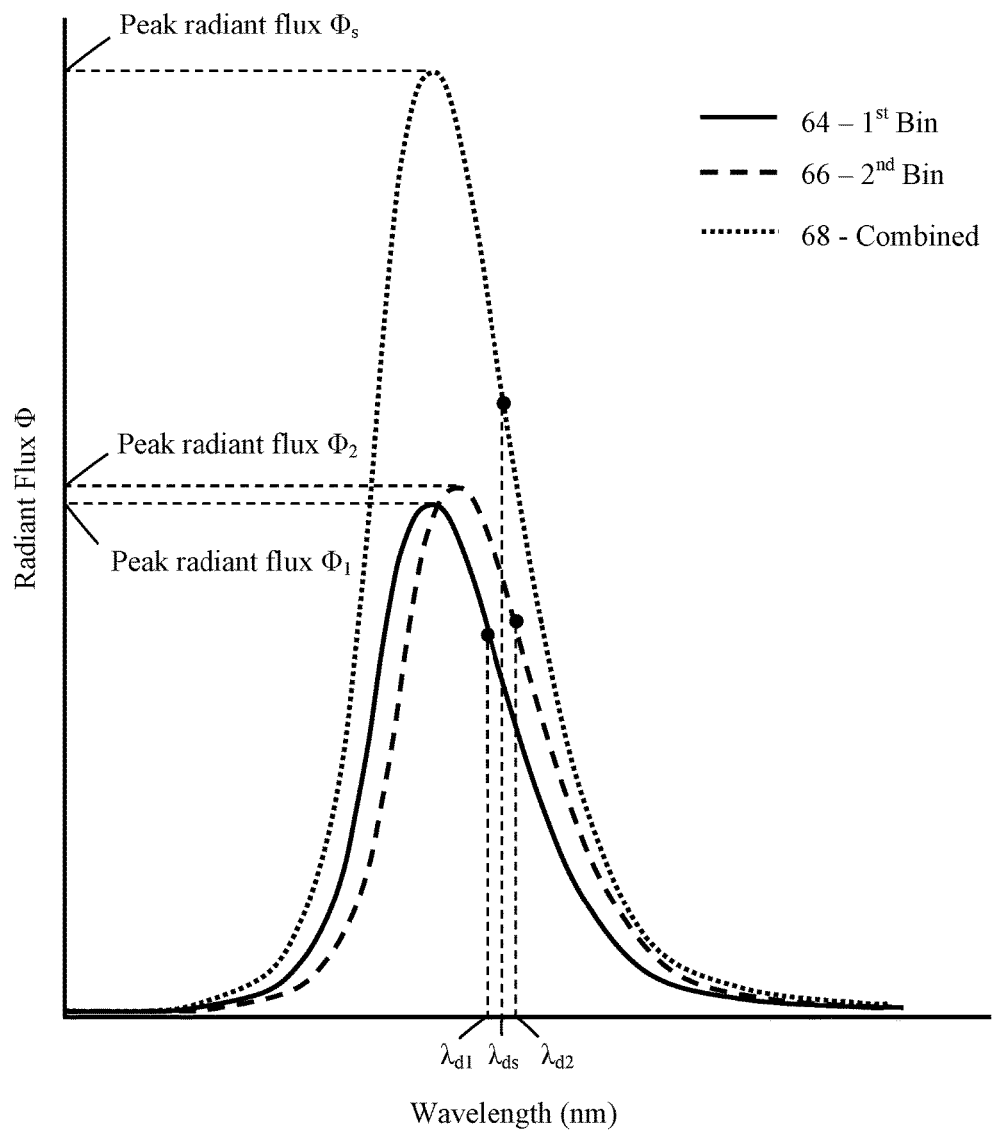
FIG. 5 is a schematic of radiant flux versus wavelength for an LED-based light source in accordance with the invention.

The method of selecting the first and second LED dies 56, 58 to ensure that the source 24 generates light with the selected emission wavelength $\lambda_{ds}$ is now described with reference to FIG. 5 which shows plots of radiant flux versus wavelength for i) the first LED dies, ii) the second LED dies and iii) the combined output for an LED-based light source in accordance with an embodiment of the invention. As indicated by solid line 64 the first LED dies 56 generate blue light with a dominant wavelength $\lambda_{d1}$ and a peak luminous flux $\Phi_1$. The first LED dies 56 are selected from a first wavelength bin whose dominant wavelength range is shorter than the selected wavelength $\lambda_{ds}$. As indicated by dashed line 66 the second LED dies 58 generate blue light with a dominant wavelength $\lambda_{d2}$ and a peak luminous flux $F_2$. The second LED dies 58 are selected from a second wavelength bin whose dominant wavelength range is longer than the selected dominant wavelength $\lambda_{ds}$. Dotted line 68 shows the combined output 28 from the source of the selected dominant wavelength $\lambda_{ds}$ and peak luminous flux $\Phi_s$.

For a source comprising two LED dies in which the first LED die is from a first wavelength bin with a dominant wavelength $\lambda_{d1}$ and peak radiant flux $\Phi_1$ and the second LED die is from a second bin with a dominant wavelength $\lambda_{d2}$ and radiant flux $\Phi_2$ the combined light emitted by the source has a dominant wavelength $\lambda_{ds}$ that is approximately given by the relation:

$$\lambda_{ds} \cong \frac{\lambda_{d1} \cdot \Phi_1 + \lambda_{d2} \cdot \Phi_2}{\Phi_1 + \Phi_2}$$

For a source comprising $n_1$ first LED dies and $n_2$ second LED dies the source has a dominant wavelength $\lambda_{ds}$ that is approximately given by the relationship:

$$\lambda_{ds} \cong \frac{n_1 \cdot \lambda_{d1} \cdot \Phi_1 + n_2 \cdot \lambda_{d2} \cdot \Phi_2}{n_1 \cdot \Phi_1 + n_2 \cdot \Phi_2}$$

If the first and second LED dies are selected from bins having the same peak luminous flux (i.e. $\Phi_1 = \Phi_2$) the relationship reduces to:

$$\lambda_{ds} \cong \frac{n_1 \cdot \lambda_{d1} + n_2 \cdot \lambda_{d2}}{n_1 + n_2}$$

It is to be noted that whilst the forward drive voltage $V_F$ of the LED dies does not affect the emission wavelength of the source it can however be preferable to select the LED dies from bins that have the same forward drive voltage to enable each of the LED dies to be operated from a single power source. Alternatively the LED dies can be grouped by forward drive voltage enabling each group to be driven using a common power source.

TABLE 2 tabulates examples of LED bins for the first and second LED dies 56, 58 bins for a source configured to generate blue light with a selected dominant wavelength $\lambda_{ds}$ of 455 nm. As can be seen from the table whilst the LED bins have a dominant wavelength range of 2.5 nm (±1.25 nm) initial tests indicate that sources in accordance with the invention can unexpectedly generate light with a selected dominant wavelength that varies over a range of 0.4 nm (±0.2 nm). When such sources 24 are used within the lamp 10 of FIG. 1 it is found that the lamp can generate white light that on a chromaticity diagram is within two MacAdam ellipses of the selected light color. For comparison an identical lamp 10 having light sources 24 comprising a single type of LED die generates light that is typically within about five MacAdam ellipses of the selected color. It will be appreciated that the light sources of the invention enable the construction of lamps that produce a more accurate color of light. Alternatively the invention enables less expensive LED dies from wider wavelength bins to construct lamps that produce light of a consistent color.

TABLE 2

| $1^{st}$ wavelength bin $\lambda_{d1}$ (nm) | No. of $1^{st}$ LED dies $n_1$ | $2^{nd}$ wavelength bin $\lambda_{d2}$ (nm) | No. of $2^{nd}$ LED dies $n_2$ | Dominant wavelength of source $\lambda_{ds}$ |
|---|---|---|---|---|
| 445.0 | 6 | 462.5 | 6 | 455.0 ± 0.2 |
| 447.5 | 6 | 460.0 | 6 | 455.0 ± 0.2 |
| 450.0 | 6 | 457.5 | 6 | 455.0 ± 0.2 |
| 452.5 | 6 | 455.0 | 6 | 455.0 ± 0.2 |

It is envisioned in further embodiments to increase accuracy of the selected dominant wavelength of the source by increasing the total number of LED dies 56, 58. For example and as indicated in TABLE 3 for a source comprising a total of thirty six LED dies (eighteen first LED dies 56 and eighteen second LED dies 58) initial tests suggest that the source can generate light having a selected wavelength that is within 0.2 nm (±0.1 nm), that is about a tenth of the bin wavelength range.

TABLE 3

| $1^{st}$ wavelength bin $\lambda_{d1}$ (nm) | No. of $1^{st}$ LED dies $n_1$ | $2^{nd}$ wavelength bin $\lambda_{d2}$ (nm) | No. of $2^{nd}$ LED dies $n_1$ | Dominant wavelength of source $\lambda_{ds}$ |
|---|---|---|---|---|
| 445.0 | 18 | 462.5 | 18 | 455.0 ± 0.1 |
| 447.5 | 18 | 460.0 | 18 | 455.0 ± 0.1 |
| 450.0 | 18 | 457.5 | 18 | 455.0 ± 0.1 |
| 452.5 | 18 | 455.0 | 18 | 455.0 ± 0.1 |

Figure 6:
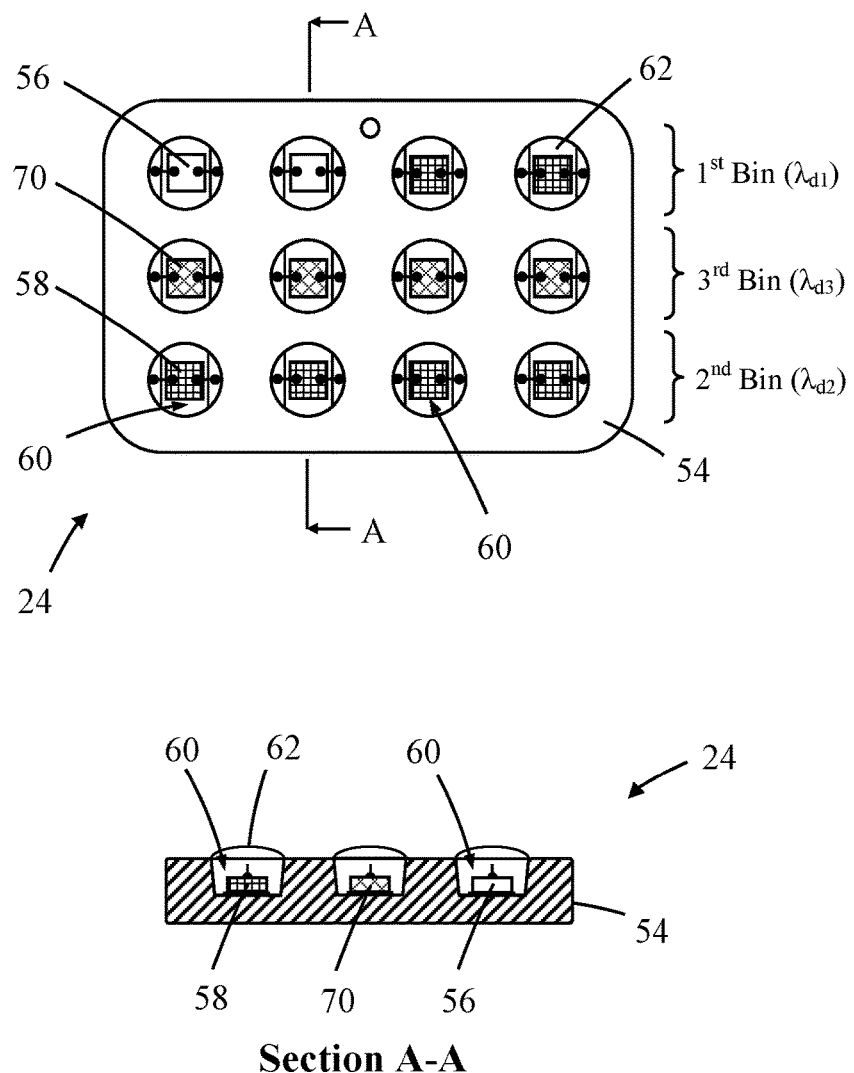
FIG. 6 shows schematic plan and sectional views of an LED-based light source in accordance with an embodiment of the invention for use in the arrangements of FIGS. 1 and 2.

FIG. 6 shows a LED-based light source that comprises LED dies from three wavelength bins. In FIG. 6 the light source comprises a total of nine LED dies comprising three LED dies 56 from a first wavelength bin, three LED dies 58 from a second wavelength bin and three LED dies 70 from a third wavelength bin. For a source comprising $n_1$ first LED dies from a first wavelength bin with a dominant wavelength $\lambda_{d1}$ and peak radiant flux $\Phi_1$, $n_2$ second LED dies from a second bin with a dominant wavelength $\lambda_{d2}$ and radiant flux $\Phi_2$ and $n_3$ third LED dies from a third bin with a dominant wavelength $\lambda_{d3}$ and radiant flux $\Phi_3$ the combined light emitted by the source has a dominant wavelength $\lambda_{ds}$ that is approximately given by the relationship:

$$\lambda_{ds} \cong \frac{n_1 \cdot \lambda_{d1} \cdot \Phi_1 + n_2 \cdot \lambda_{d2} \cdot \Phi_2 \mid n_3 \cdot \lambda_{d3} \cdot \Phi_3}{n_1 \cdot \Phi_1 + n_2 \cdot \Phi_2 + n_3 \cdot \Phi_3}.$$

It is envisioned in further LED-based sources for generating blue light with a selected dominant wavelength it is envisioned to house blue LED dies from four or more wavelength bins.

Moreover whilst in the foregoing embodiments the source is described as comprising equal numbers of LED dies from different bins it will be appreciated that the source can comprise differing numbers of LED dies.

Figure 7:
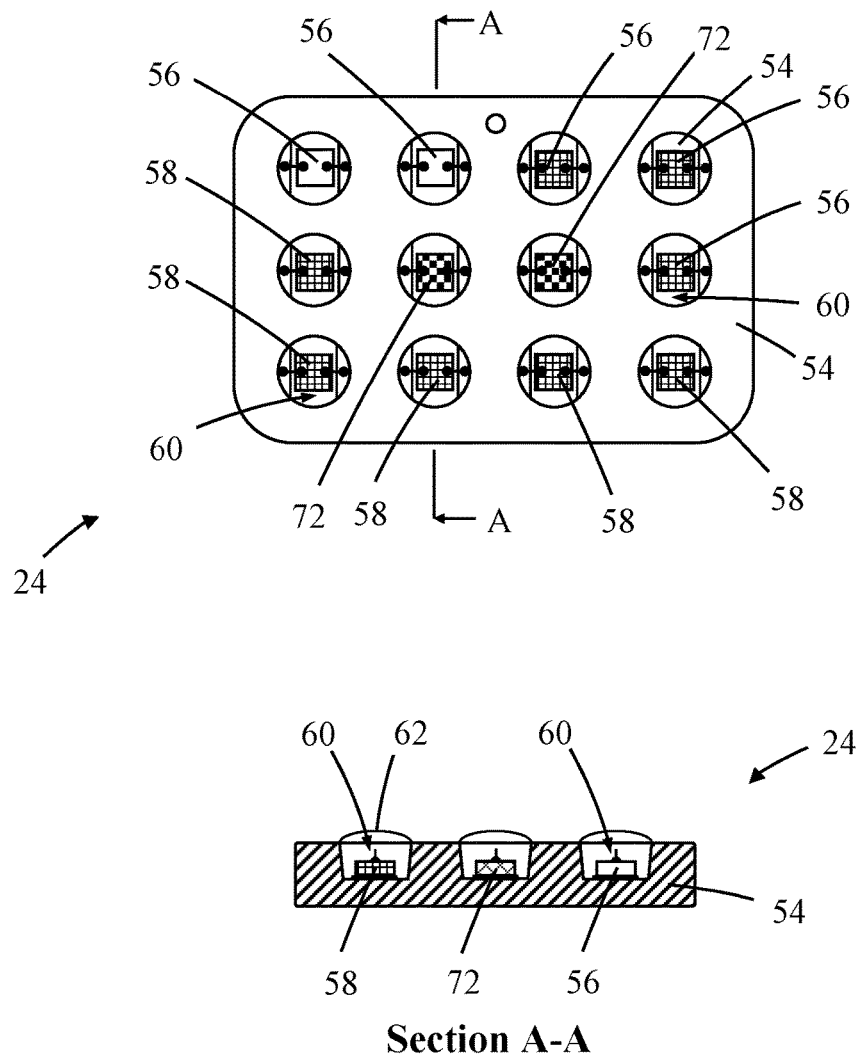
FIG. 7 shows schematic plan and sectional views of an LED-based light source in accordance with an embodiment of the invention for use in the arrangements of FIGS. 1 and 2.

In applications where it is required for the lamp 10 to generate light with a high CRI (Color Rendering Index), that is a CRI>90, it is envisioned for the source 24 to additionally comprise one or more red emitting LED dies that are operable to generate red light of wavelength in a range 630 nm to 740 nm. FIG. 7 shows such a light source 24 that comprises five blue LED dies 56 from a first wavelength bin, five blue LED dies 58 from a second wavelength bin and two red LED dies 72. As with the blue LED dies the source can comprise a plurality of red LED dies that are selected from different wavelength bins such that their combined output is red light of a selected dominant wavelength.

LED-Based Light Emitting Devices

Whilst the LED-based light sources 24 of the invention find particular application in lighting arrangements and lamps that comprise a separate wavelength conversion component 36 the invention also finds application in light emitting devices in which the photoluminescence material is incorporated in the device as opposed to being provided in a separate wavelength conversion component. Examples of such devices are shown in FIGS. 8 and 9.

Figure 8:
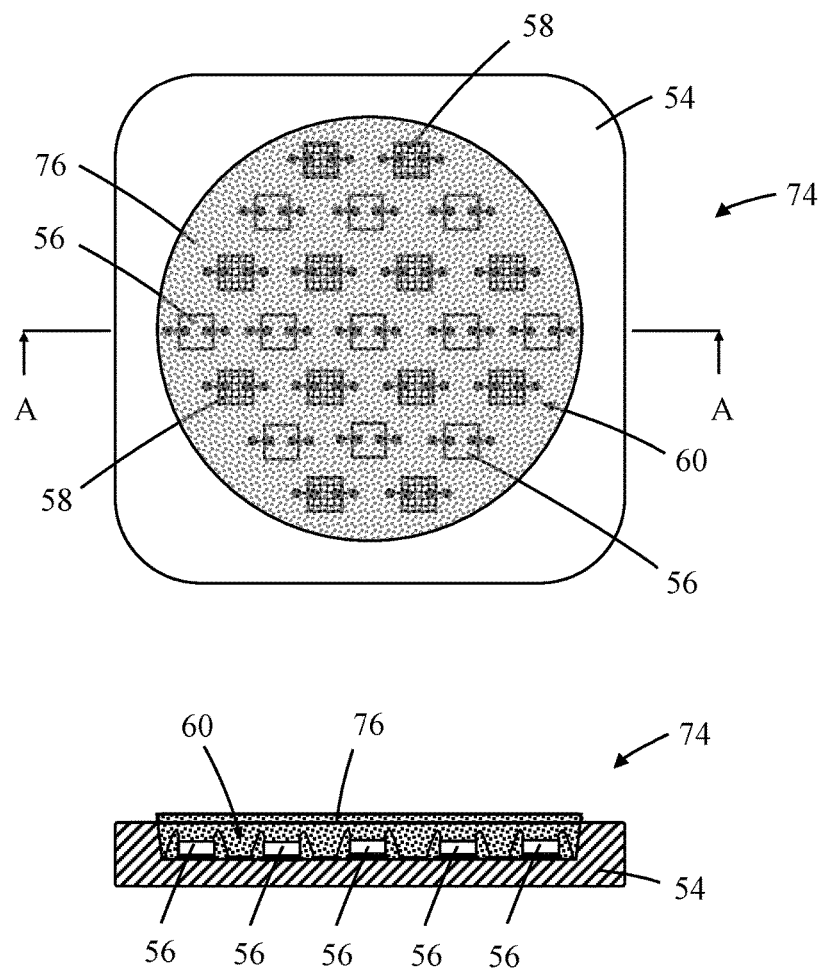
FIG. 8 shows schematic plan and sectional views of an LED-based light emitting device in accordance with an embodiment of the invention.

In the example of FIG. 8 the light emitting device 74 comprises a package 54 having a single circular recess 60 that houses the first and second blue LED dies 56, 58. As indicated the LED dies are configured as a hexagonal array of twenty three LED dies comprising eleven first blue LED dies 56 and twelve second blue LED dies 58. The recess 60 is filled with a light transmissive encapsulation 76 that includes one or more photoluminescence materials. It will be appreciated that the device of FIG. 8 comprises the light source 24 of FIG. 3 with the photoluminescence material incorporated in the device in the form of an encapsulation 76.

Figure 9:
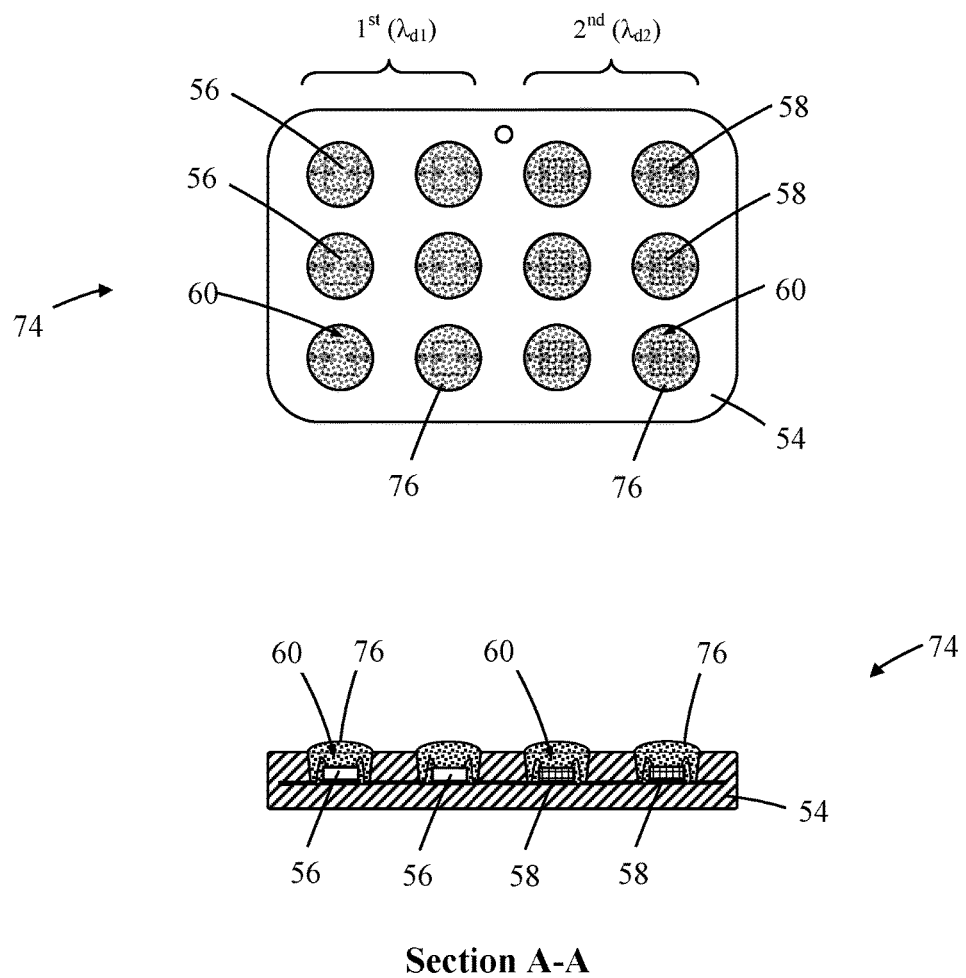
FIG. 9 shows schematic plan and sectional views of an LED-based light emitting device in accordance with an embodiment of the invention.

In the example show in FIG. 9 the device 74 comprises a package 54 having an array of circular recesses 60 in which each recess is configured to house a respective one of the LED dies 56, 58. The package can as shown comprise a square array of twelve cavities 60 (three rows by four columns) for housing six first LED dies 56 and six second LED dies 58. Each of the recesses 60 is filled with a light transmissive encapsulation 76 that includes one or more photoluminescence materials. It will be appreciated that the device of FIG. 9 comprises the light source 24 of FIG. 2 with the photoluminescence material incorporated in the device in the form of an encapsulation 76.

It will be appreciated that the invention is not limited to the exemplary embodiments described and that variations can be made within the scope of the invention. For example the number of LED dies, number of LED bins and packaging arrangements can be varied without departing from the inventive concepts of the invention.

What is claimed is:

1. A lighting arrangement comprising:
    a first excitation source that generates excitation light having a first dominant wavelength in a range 450 nm to 480 nm;
    a second excitation source that generates excitation light having a second dominant wavelength in a range 450 nm to 480 nm, wherein the first dominant wavelength is different from the second dominant wavelength by at least 2.5 nm; and
    a photoluminescence material that converts at least a portion of the excitation light to light of a different wavelength;
    wherein the emission product of the arrangement comprises a combination of the excitation light generated by the first and second excitation sources and light generated by the at least one photoluminescence material.

2. The lighting arrangement of claim 1, wherein the first excitation source comprises a plurality of LEDs each of which generates excitation light having a dominant wavelength that is within a 2.5 nm wavelength range of one another.

3. The lighting arrangement of claim 1, wherein the second excitation source comprises a plurality of LEDs each of which generates excitation light having a dominant wavelength that is within a 2.5 nm wavelength range of one another.

4. The lighting arrangement of claim 1, further comprising a third excitation source that generates excitation light having a third dominant wavelength in a range 450 nm to 480 nm, wherein the third dominant wavelength is different to the first and second dominant wavelength range.

5. The lighting arrangement of claim 4, wherein the first excitation source comprises a plurality of LEDs each of which generates excitation light having a dominant wavelength that is within a 2.5 nm wavelength range of one another.

6. The lighting arrangement of claim 5, wherein the second excitation source comprises a plurality of LEDs each of which generates excitation light having a dominant wavelength that is within a 2.5 nm wavelength range of one another.

7. The lighting arrangement of claim 6, wherein the third excitation source comprises a plurality of LEDs each of which generates excitation light having a dominant wavelength that is within a 2.5 nm wavelength range of one another.

8. The lighting arrangement of claim 1, wherein the dominant wavelength of excitation light generated by a combination of the two excitation sources varies over a range of 0.4 nm.

9. The lighting arrangement of claim 1, wherein the dominant wavelength of excitation light generated by a combination of the two excitation sources varies over a range of 0.2 nm.

10. The lighting arrangement of claim 1, further comprising a first red source that generates red light having a dominant wavelength in a wavelength range 630 nm to 740 nm and a second red source that generates second red light having a dominant wavelength in a wavelength range 630 nm to 740 nm, wherein the dominant wavelengths of the first red light and second red light are different.

11. The lighting arrangement of claim 10, wherein the first red source comprises a plurality of LEDs that generate red light having a dominant wavelength that is within a 2.5 nm wavelength range of one another.

12. The lighting arrangement of claim 11, wherein the second red source comprises a plurality of LEDs that generate red light having a dominant wavelength are within a 2.5 nm wavelength range of one another.

13. The lighting arrangement of claim 11, further comprising a third red source that generates third red light having a dominant wavelength in a range 630 nm to 740 nm, wherein the dominant wavelength of the third red light is different to the dominant wavelength of the first and second red light.

14. The lighting arrangement of claim 13, wherein at least one of the first, second or third red sources comprises a plurality of LEDs that generate red light having a dominant wavelength that is within a 2.5 nm wavelength range of one another.

15. The lighting arrangement of claim 10, wherein the dominant wavelengths of the first red light and second red light are different by at least 2.5 nm.

16. The lighting arrangement of claim 1, wherein the photoluminescence material is provided remotely to at least one of the first or second excitation sources.

17. The lighting arrangement of claim 1, wherein the photoluminescence material is packaged with at least one of the first or second excitation sources.

18. The lighting arrangement of claim 1, wherein the photoluminescence material corresponds to a layer that commonly overlays both the first excitation source and the second excitation source.

\* \* \* \* \*